United States Patent
Kominami et al.

(10) Patent No.: US 8,860,213 B2
(45) Date of Patent: Oct. 14, 2014

(54) POWER CONVERTER

(71) Applicant: Hitachi, Ltd., Tokyo (JP)

(72) Inventors: Tsutomu Kominami, Hitachinaka (JP); Mami Kunihiro, Hitachi (JP); Katsumi Ishikawa, Hitachinaka (JP); Yosuke Yasuda, Mito (JP); Sunao Funakoshi, Kasumigaura (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 13/962,092

(22) Filed: Aug. 8, 2013

(65) Prior Publication Data

US 2014/0042611 A1 Feb. 13, 2014

(30) Foreign Application Priority Data

Aug. 8, 2012 (JP) .................................. 2012-175571

(51) Int. Cl.
  *H01L 23/34* (2006.01)
  *H01L 21/00* (2006.01)
(52) U.S. Cl.
  USPC .......................................... 257/722; 438/122
(58) Field of Classification Search
  USPC .................. 257/712, 719–722; 438/122, 584
  See application file for complete search history.

(56) References Cited

U.S. PATENT DOCUMENTS

2012/0050993 A1*  3/2012  Suzuki et al. ................. 361/700

FOREIGN PATENT DOCUMENTS

| JP | 2002-176497 | * | 7/1992 | ............ H01L 23/427 |
| JP | 2003-298268 |   | 10/2003 | |
| JP | 2006-224796 |   | 8/2006 | |

* cited by examiner

*Primary Examiner* — Calvin Lee
(74) *Attorney, Agent, or Firm* — Antonelli, Terry, Stout & Kraus, LLP.

(57) ABSTRACT

A power converter including: a plurality of semiconductor devices forming a power conversion circuit; a base section to which the plurality of semiconductor devices are attached; and radiating fins dissipating heat generated from the semiconductor devices into outside air, in the power converter in which the direction of the flow of a refrigerant flowing into the radiating fins changes depending on the operation status of the power conversion circuit, the shape of each radiating fin changes in such a way that the cross-sectional area of a channel of the refrigerant on the outflow side becomes smaller than the cross-sectional area of the channel of the refrigerant on the inflow side in the radiating fins depending on the direction of the flow of the refrigerant.

6 Claims, 3 Drawing Sheets

| FIN SPACING (CONSTANT SPACING = 100%) | WIND-WARD 100% | LEE-WARD 100% | WIND-WARD 100% | LEE-WARD 99.4% | WIND-WARD 100% | LEE-WARD 98.8% |
|---|---|---|---|---|---|---|
| TEMPERATURE DISTRIBUTION | DIRECTION OF WIND → | | DIRECTION OF WIND → | | DIRECTION OF WIND → | |
| MAXIMUM TEMPERATURE (CONSTANT SPACING = 100%) | 100% | | 95.1% | | 91.7% | |

| COMBINATION | MATERIAL OF FIN 1 | MATERIAL OF DISSIMILAR METAL 6 |
|---|---|---|
| 1 | ALUMINUM | COPPER |
| 2 | DURALUMIN | ALUMINUM |

POWER CONVERTER

BACKGROUND OF THE INVENTION

1. Field of the Invention

The present invention relates to cooling of a power converter and, in particular, relates to cooling of a power converter in which the direction of cooling air changes.

2. Description of the Related Art

Power converters such as a converter and an inverter are installed in an electric railway vehicle to drive a motor that drives the vehicle. These power converters perform power conversion by switching of semiconductor devices such as an IGBT (insulated gate bipolar transistor) and a GTO (gate turnoff thyristor).

In a semiconductor device, a conduction loss and a switching loss occur and are converted into heat. When this heat raises the temperature of the semiconductor device, there is a possibility of a reduction in conversion efficiency, a breakdown of the device, and the like. Therefore, it is necessary to cool the semiconductor device in such a way that the semiconductor device is in a predetermined temperature range. Since a power converter is mainly installed under the floor of a vehicle, for example, where the installation space is limited, it is necessary to cool a plurality of semiconductor devices efficiently with a small device configuration.

Here, the direction of traveling of the railway vehicle changes at a terminal and, when the railway vehicle travels forward and when the railway vehicle travels backward, equal heat is generated in any of these cases. In a cooler of a power converter, the cooler using a wind generated when the railway vehicle is running as cooling air, it is necessary to ensure cooling capability that does not depend on the direction of traveling. In the cooler of the power converter, the cooler using the wind generated when the vehicle is running for cooling, since a semiconductor device placed on the leeward side is cooled by the cooling air heated by the heat of a semiconductor device placed on the windward side, the temperature of the semiconductor device placed on the leeward side becomes higher than the temperature on the windward side. This makes it necessary to design the cooler in such a way that the temperature of the semiconductor device placed on the leeward side is in a predetermined temperature range. As a result, the semiconductor device placed on the windward side is cooled more than necessary, and the cooler increases in size as a cooler for the semiconductor device placed on the windward side.

JP-A-2003-298268 (hereinafter Patent Document 1) has a cooling air flow adjustment mechanism to cool a heating element efficiently and the cooling air flow adjustment mechanism has a shape in which the channel from the upstream side to the downstream side becomes narrow. With this shape, the cooling capability of a heat dissipation section provided in a downstream part is improved. Next, JP-A-2006-224796 (hereinafter Patent Document 2) provides, in a cooler of a converter for a railway, an air flow-guide plate for adjusting the volume of air which the cooler takes in to improve a trade-off between the time of low-speed driving in which only a small volume of wind generated when a vehicle is running is obtained in spite of high load and the time of high-speed driving in which, although the load is low, the volume of wind generated when a vehicle is running is large and cooling is performed more than necessary.

For example, a power converter for a railway vehicle, the power converter using, for cooling, a wind generated when the vehicle is running, needs to ensure cooling capability that does not depend on the direction of cooling air because the direction of the cooling air when the railway vehicle travels forward is reversed when the railway vehicle travels backward and equal heat is generated in any of these cases. Here, with the structure described in Patent Document 1, the cooling capability of the heat dissipation section provided on the downstream side is improved when the direction of the cooling air is one direction. However, when the direction of the cooling air is reversed, the cooling capability of the heat dissipation section provided on the downstream side is significantly reduced. This makes it impossible to eliminate the temperature difference between the semiconductor device placed on the windward side and the semiconductor device placed on the leeward side when the vehicle travels forward and when the vehicle travels backward. Moreover, although the existing technique described in Patent Document 2 can adjust the volume of air in accordance with the speed of the vehicle, this technique also cannot eliminate the temperature difference between the semiconductor device placed on the windward side and the semiconductor device placed on the leeward side when the vehicle travels forward and when the vehicle travels backward.

SUMMARY OF THE INVENTION

It is an object of the invention to level out the temperature difference between a semiconductor device placed on the windward side and a semiconductor device placed on the leeward side irrespective of the direction of cooling air of a power converter.

To achieve the above object, an aspect of the invention is directed to a power converter including a plurality of semiconductor devices forming a power conversion circuit and a cooler dissipating the heat from the semiconductor devices into outside air, the power converter in which the direction of a refrigerant flowing into the cooler changes depending on the operation status of the power conversion circuit, the power converter in which the cooler is formed of a base to which the plurality of semiconductor devices are attached and radiating fins dissipating heat into the outside air and changes in such a way that the cross-sectional area of a channel of the refrigerant on the outflow side becomes smaller than the cross-sectional area of the channel of the refrigerant on the inflow side in response to the refrigerant whose direction changes.

According to the aspect of the invention, in the power converter, irrespective of the direction of a wind generated when a railway vehicle is running, the wind that changes depending on the direction of traveling of a railway vehicle, it is possible to level out the temperature difference between the semiconductor device placed on the windward side and the semiconductor device placed on the leeward side.

DESCRIPTION OF THE PREFERRED EMBODIMENTS

Hereinafter, embodiments of the invention will be described with reference to the drawings.

First Embodiment

Figures 5, 6, 7:
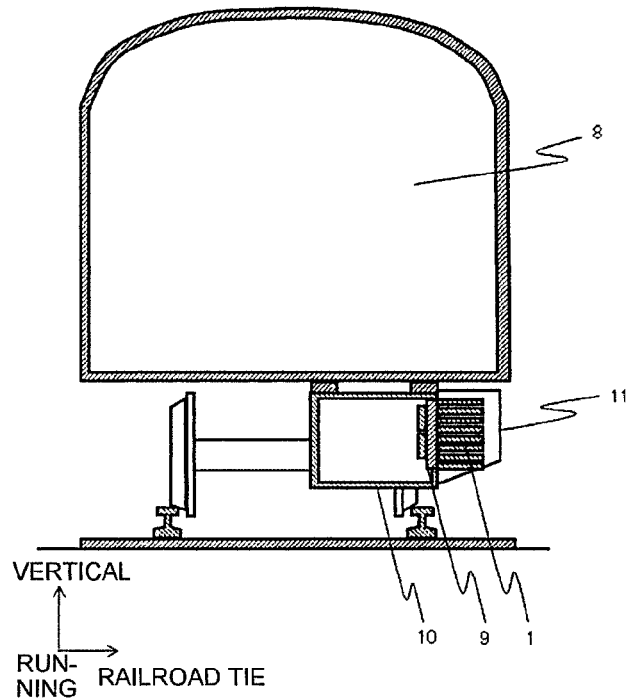
FIG. 5 is a sectional view of a power converter according to an embodiment of the invention, the power converter viewed from the direction in which a vehicle is running in a state in which the power converter is installed in a railway vehicle.
FIG. 6 shows the effect of narrowing of the fin spacing on the leeward side.
FIG. 7 shows material combination examples of a fin 1 and a dissimilar metal 6.

An embodiment of the invention will be described. FIG. 5 is a sectional view showing a state in which a power converter is installed in a railway vehicle. The power converter is housed in a case 10 installed under the floor of a compartment 8. A cooler of the power converter has a plurality of semiconductor devices 9 attached to one side of a base section 5, the semiconductor devices 9 forming a power conversion circuit, and has, on the other side of the base section 5, fins 1 for heat dissipation. The fins 1 are placed in such a way as to jut from the case 10 and receive a wind generated when the vehicle is running, and the fins 1 are covered with a cover 11 having a vent hole.

Figure 1:
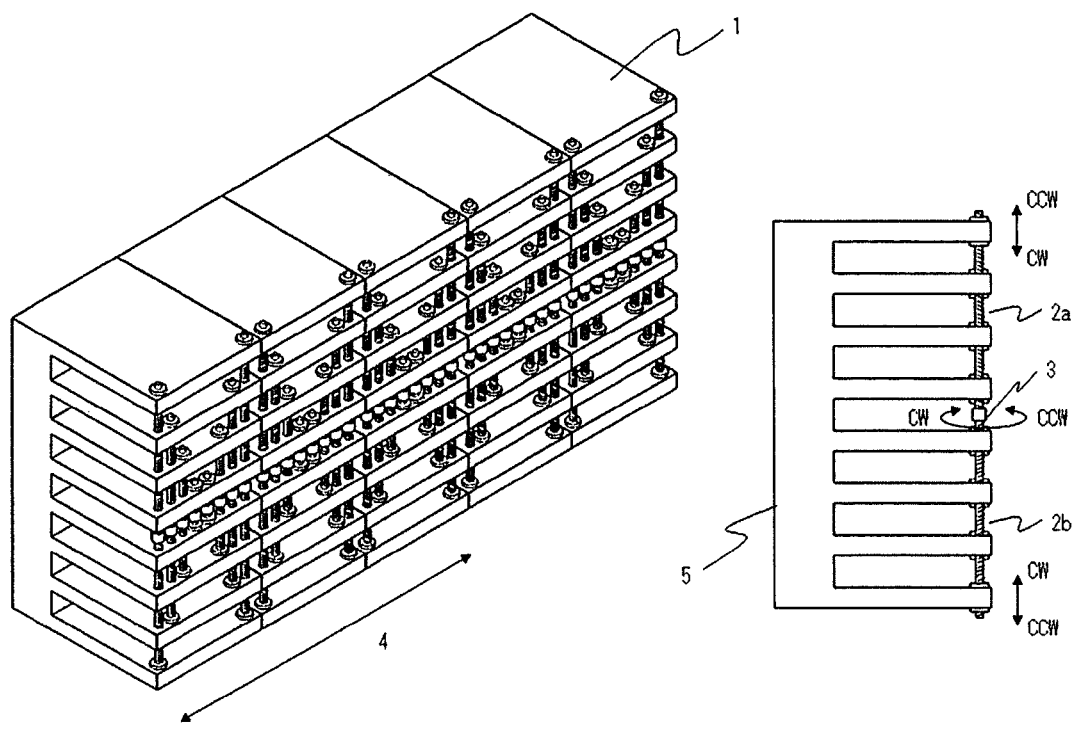
FIG. 1 is a perspective view and a side view of a cooler attached to a power converter according to a first embodiment of the invention.

FIG. 1 shows a first embodiment of the invention. In FIG. 1, 1 denotes fins, 2 denotes ball screws, 3 denotes actuators, 4 denotes the direction of cooling air, and 5 denotes a semiconductor device installation surface. In the ball screws 2a and 2b, screw threads are cut in opposite directions, and the ball screws 2a and 2b move in opposite directions with the movement of the actuator 3 that rotates in a clockwise direction (CW) and in a counterclockwise direction (CCW). Here, when there are an even number of fins (2m, m=1, 2, . . . ), in FIG. 1, it is assumed that fin numbers are 1, 2, . . . , and 2m from above. At this time, the tip (the uppermost portion) of the ball screw 2a, the tip on the side opposite to the actuator 3, is fixed to a fin No. n (n<m), and the tip (the lowermost portion) of the ball screw 2b, the tip on the side opposite to the actuator 3, is fixed to a fin No. (2m+1−n) (n=1, 2, . . . , m). That is, in an example in which eight fins are provided as shown in FIG. 1, there are ball screws connected to a fin No. 1 and a fin No. 8, ball screws connected to a fin No. 2 and a fin No. 7, ball screws connected to a fin No. 3 and a fin No. 6, and ball screws connected to a fin No. 4 and a fin No. 5, and these ball screws can bend two fins to which the ball screws are connected inward with the movement of the actuator 3.

When there are an odd number of fins (2m+1, m=1, 2, . . . ), as in the case of an even numbered fins, it is assumed that fin numbers are 1, 2, . . . , and 2m+1 from above. At this time, the tip (the uppermost portion) of the ball screw 2a, the tip on the side opposite to the actuator 3, is fixed to a fin No. n (n<m), and the tip (the lowermost portion) of the ball screw 2b, the tip on the side opposite to the actuator 3, is fixed to a fin No. (2(m+1)−n). That is, in an example in which nine fins are provided, there are ball screws connected to a fin No. 1 and a fin No. 9, ball screws connected to a fin No. 2 and a fin No. 8, ball screws connected to a fin No. 3 and a fin No. 7, and ball screws connected to a fin No. 4 and a fin No. 6, and these ball screws can bend two fins to which the ball screws are connected inward with the movement of the actuator 3. Incidentally, when there are an odd number of fins, a fin No. m+1 is not fixed to a ball screw.

Here, when there are an even number of fins, the actuator 3 is supported in an intermediate position between a fin No. m and a fin No. m+1 by a support member which is not shown in FIG. 1. When there are an odd number of fins, the actuator 3 is supported by a fin No. m+1.

As a result, if the actuator 3 is rotated in a counterclockwise direction, since the fin fixed to the ball screw 2a bends downward (toward the side where the actuator is located) and the fin fixed to the ball screw 2b bends upward (toward the side where the actuator is located), the fins bend in the direction in which the fins reduce the cross-sectional area of a channel through which the cooling air passes. If the actuator 3 is rotated in a clockwise direction, the fins bend in the direction in which the fins increase the cross-sectional area of the channel through which the cooling air passes.

By making the fin spacing between the leeward-side fins narrower than the windward-side fin spacing by using this mechanism, the cross-sectional area of the channel on the leeward side becomes smaller than the cross-sectional area of the channel on the windward side, which produces an increase in air velocity and improves cooling performance. In a railway vehicle using, as cooling air, a wind generated when the vehicle is running, the direction of the cooling air changes depending on the direction of traveling. Therefore, by narrowing the fin spacing on the rear side in the direction of traveling or in a high temperature portion based on the information on the direction of traveling of the railway vehicle or the temperature information of the semiconductor device installation surface, even when the direction of traveling of the vehicle changes, it is possible to uniformize the cooling capability of the cooler on the windward side and the leeward side and uniformize the temperature of the semiconductor devices attached to the cooler.

In FIG. 6, the effect of narrowing of the fin spacing on the leeward side is shown. The contour map of FIG. 6 reveals that, by narrowing the fin spacing on the leeward side by about 1.2%, the maximum temperature drops by about 8.3%, which suggests that the temperature distribution is uniformized.

Incidentally, the fin spacing is adjusted by sensing the leeward side in which a larger amount of heat is generated based on the temperature sensor information of a thermistor or the like attached to the semiconductor device installation surface or detecting the leeward side by obtaining the information on the direction of traveling from the control platform of the railway vehicle.

Second Embodiment

Figure 2:
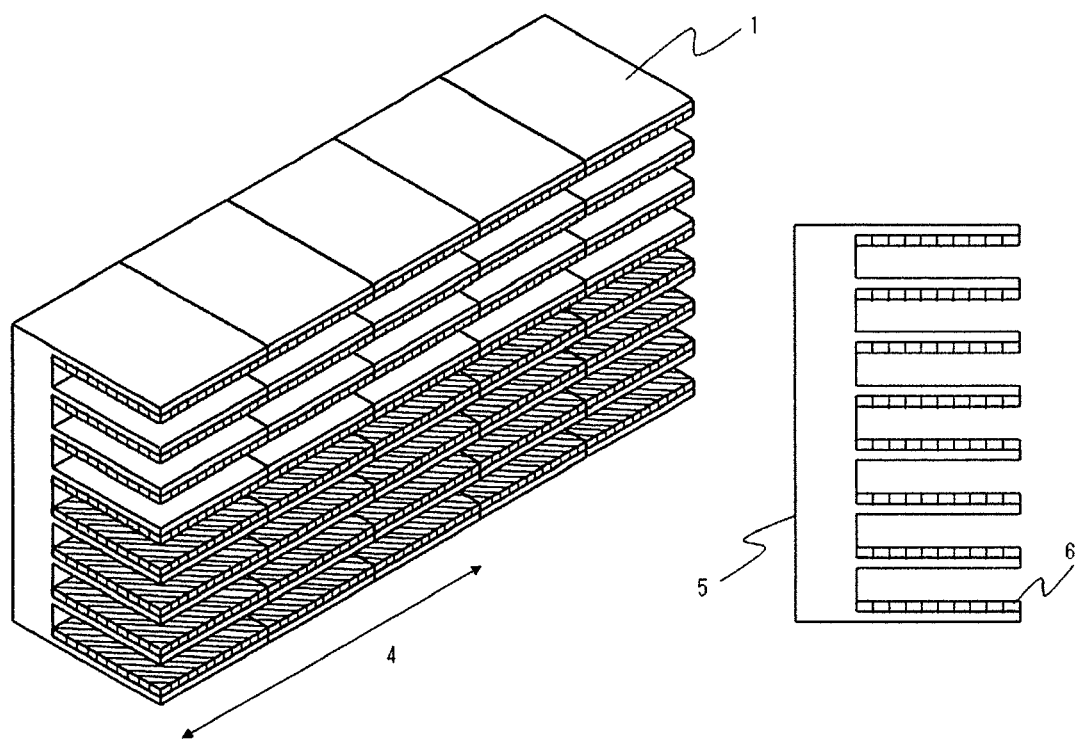
FIG. 2 is a perspective view and a side view of a cooler attached to a power converter according to a second embodiment of the invention.

FIG. 2 is a configuration diagram of a cooler in a second embodiment. The feature of this embodiment is that the fins 1 are each made of two types of metals having different coefficients of linear expansion, the two types of metals bonded together. In the fin 1, 6 denotes a metal which is different from the material of the fin 1. When the semiconductor devices produce heat and the heat is transferred to the fins, the fins bend due to the difference in coefficient of linear expansion between the two types of metals. Here, by making the coefficient of linear expansion of the dissimilar metal 6 lower than the coefficient of linear expansion of the fins 1, the fins bend in the direction in which the fins reduce the cross-sectional area of the channel through which the cooling air passes. That is, by making the coefficient of linear expansion of a metal located on the inner side of the fin lower than the coefficient of linear expansion of a metal located on the outer side of the fin, it is possible to reduce the cross-sectional area of the channel of the cooling air passing through the inside of the fins.

In a plate fin, since the temperature of the semiconductor device on the leeward side is higher than the temperature of the semiconductor device on the windward side, the fin on the leeward side bends greatly as compared to the fin on the windward side, and the cross-sectional area of the channel of the cooling air becomes smaller from windward to leeward. Incidentally, material combination examples of the fin 1 and the dissimilar metal 6 are shown in FIG. 7. In combination 1, aluminum is used as the fin 1 and copper is used as the dissimilar metal 6. In combination 2, duralumin is used as the fin 1 and aluminum is used as the dissimilar metal 6.

Third Embodiment

Figure 3:
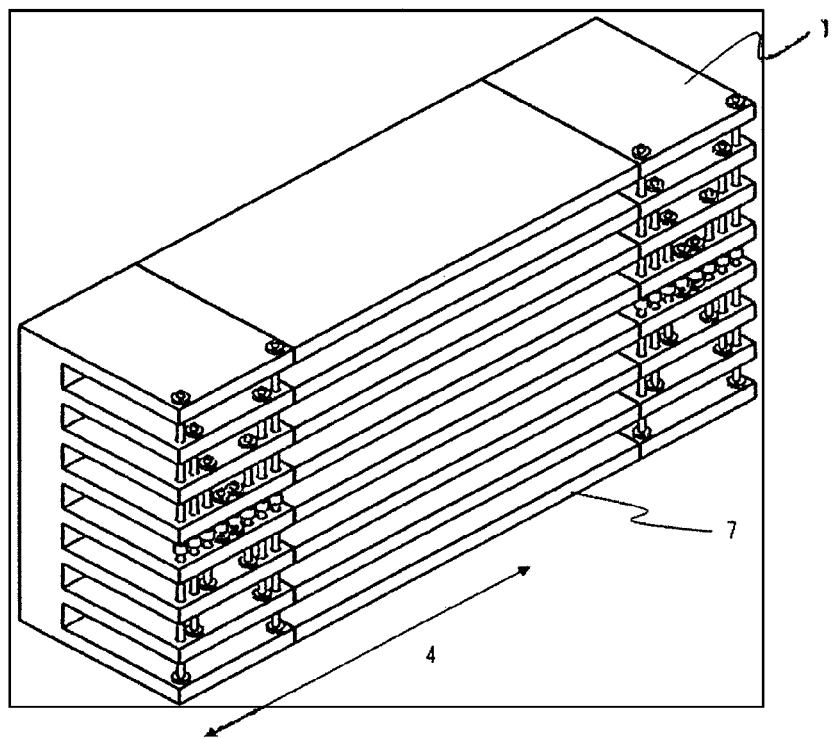
FIG. 3 is a perspective view of a cooler attached to a power converter according to a third embodiment of the invention.

FIG. 3 is a configuration diagram of a cooler in a third embodiment. In the first embodiment, a mechanism for changing the fin spacing is placed over the entire surface of the fins. However, as shown in FIG. 3, even when the fin spacing is changed in part on the leeward side, the effect of the invention is produced. Therefore, plate fins are provided in an intermediate section, and the actuator 3 and ball screws 2*a* and 2*b* for changing the fin spacing are attached only to both ends. According to this embodiment, it is possible to produce the effect of reducing the temperature difference between windward and leeward with a simpler structure than the first embodiment.

Fourth Embodiment

Figure 4:
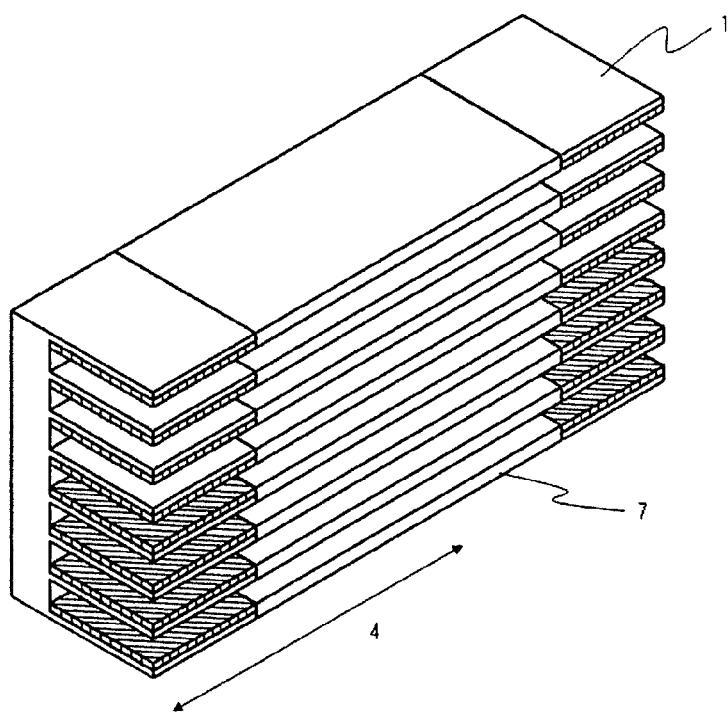
FIG. 4 is a perspective view of a cooler attached to a power converter according to a fourth embodiment of the invention.

FIG. 4 is a configuration diagram of a cooler in a fourth embodiment. In the second embodiment, fins for changing the fin spacing are placed over the entire surface of the fins. However, as shown in FIG. 4, even when the fin spacing is changed in part on the leeward side, the effect of the invention is produced. Therefore, plate fins are provided in an intermediate section, and fins with the dissimilar metal 6 for changing the fin spacing attached thereto are provided only at both ends. According to this embodiment, it is possible to produce the effect of reducing the temperature difference between windward and leeward with a simpler structure than the second embodiment.

In the embodiments described above, the description has been given by taking up a railway vehicle as an example. However, an embodiment of the invention can also be applied to a power converter other than a power converter for a railway vehicle as long as the power converter is a power converter in which the direction of a refrigerant flowing into a cooler changes depending on the operation status of the power converter.

What is claimed is:

1. A power converter comprising:
    a plurality of semiconductor devices forming a power conversion circuit;
    a base section to which the plurality of semiconductor devices are attached; and
    radiating fins dissipating heat generated from the semiconductor devices into outside air,
    wherein
    in the power converter in which the direction of a flow of a refrigerant flowing into the radiating fins changes depending on an operation status of the power conversion circuit,
    the shape of each radiating fin changes in such a way that the cross-sectional area of a channel of the refrigerant on an outflow side becomes smaller than the cross-sectional area of the channel of the refrigerant on an inflow side in the radiating fins depending on the direction of the flow of the refrigerant.

2. The power converter according to claim 1, comprising:
    an actuator for adjusting the spacing between the radiating fins.

3. The power converter according to claim 1, comprising:
    a temperature measuring unit measuring the temperature of the semiconductor devices,
    wherein
    the direction of the refrigerant flowing into the radiating fins is determined based on the temperature measurement result.

4. The power converter according to claim 1, wherein
    the direction of the refrigerant flowing into the radiating fins is determined based on a drive condition of the power conversion circuit.

5. The power converter according to claim 1, wherein each radiating fin is formed of at least two types of metals having different coefficients of linear expansion.

6. The power converter according to claim 5, wherein
    the spacing between the radiating fins changes in accordance with the temperature of the radiating fins.

* * * * *